United States Patent
Chetlur et al.

(10) Patent No.: US 10,622,549 B2
(45) Date of Patent: Apr. 14, 2020

(54) SIGNAL ISOLATOR HAVING INTERPOSER

(71) Applicant: Allegro MicroSystems, LLC, Manchester, NH (US)

(72) Inventors: Sundar Chetlur, Bedford, NH (US); Harianto Wong, Southborough, MA (US); Maxim Klebanov, Manchester, NH (US); William P. Taylor, Amherst, NH (US); Michael C. Doogue, Bedford, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 15/689,185

(22) Filed: Aug. 29, 2017

(65) Prior Publication Data
US 2019/0067562 A1 Feb. 28, 2019

(51) Int. Cl.
| | | |
|---|---|---|
| *H01L 43/00* | (2006.01) | |
| *H01L 43/06* | (2006.01) | |
| *H01L 43/04* | (2006.01) | |
| *H01L 25/065* | (2006.01) | |
| *H01L 43/14* | (2006.01) | |
| *H01L 23/64* | (2006.01) | |
| *H01L 23/538* | (2006.01) | |
| *H01L 43/08* | (2006.01) | |
| *H01F 5/00* | (2006.01) | |

(52) U.S. Cl.
CPC .......... *H01L 43/065* (2013.01); *H01L 23/538* (2013.01); *H01L 23/645* (2013.01); *H01L 25/0655* (2013.01); *H01L 43/04* (2013.01); *H01L 43/14* (2013.01); *H01F 5/003* (2013.01); *H01L 43/06* (2013.01); *H01L 43/08* (2013.01)

(58) Field of Classification Search
CPC .......................... H01L 25/0655; H01L 23/538
See application file for complete search history.

(56) References Cited

U.S. PATENT DOCUMENTS

| | | | |
|---|---|---|---|
| 5,556,811 A * | 9/1996 | Agatstein | G06F 1/26 257/E23.068 |
| 7,259,545 B2 | 8/2007 | Stauth et al. | |
| 7,768,083 B2 | 8/2010 | Doogue et al. | |
| 7,973,527 B2 | 7/2011 | Taylor et al. | |

(Continued)

OTHER PUBLICATIONS

U.S. Appl. No. 15/363,285, filed Nov. 29, 2016, Milano, et al.

(Continued)

*Primary Examiner* — Samuel A Gebremariam
(74) *Attorney, Agent, or Firm* — Daly Crowley Mofford & Durkee, LLP (57) ABSTRACT

Methods and apparatus for a signal isolator having a dielectric interposer supporting first and second die each having a magnetic field sensing element. A first signal path extends from the first die to the second die and a second signal path extends from the second die to the first die. In embodiments, the first signal path is located in the interposer and includes a first coil to generate a magnetic field and the second signal path is located in the interposer and includes a second coil to generate a magnetic filed. The first coil is located in relation to the second magnetic field sensing element of the second die and the second coil is located in relation to the first magnetic field sensing element of the first die.

30 Claims, 6 Drawing Sheets

(56) References Cited

U.S. PATENT DOCUMENTS 8,063,634 B2 11/2011 Sauber et al.
2002/0027488 A1* 3/2002 Hayat-Dawoodi ..... H01L 27/22
335/78

OTHER PUBLICATIONS

U.S. Appl. No. 15/653,820, filed Jul. 19, 2017, Latham.
Daughton; "Spin-Dependent Sensors"; Proceedings of the IEEE, vol. 91, No. 5; pp. 681-686; May 5, 2003; 6 Pages.

* cited by examiner

SIGNAL ISOLATOR HAVING INTERPOSER

BACKGROUND

As is known in the art, signal isolators can be used to transfer information without a physical or electrical connection. For example, optocouplers can include a LED that emits light through an optically transparent insulating film (or dielectric) and strikes a photo detector that generates a current flow corresponding to the emitted light. RF carriers can also be used to transmit information through a barrier. Some known isolators use capacitive coupling and some known isolators use inductive coupling.

Figure 1:
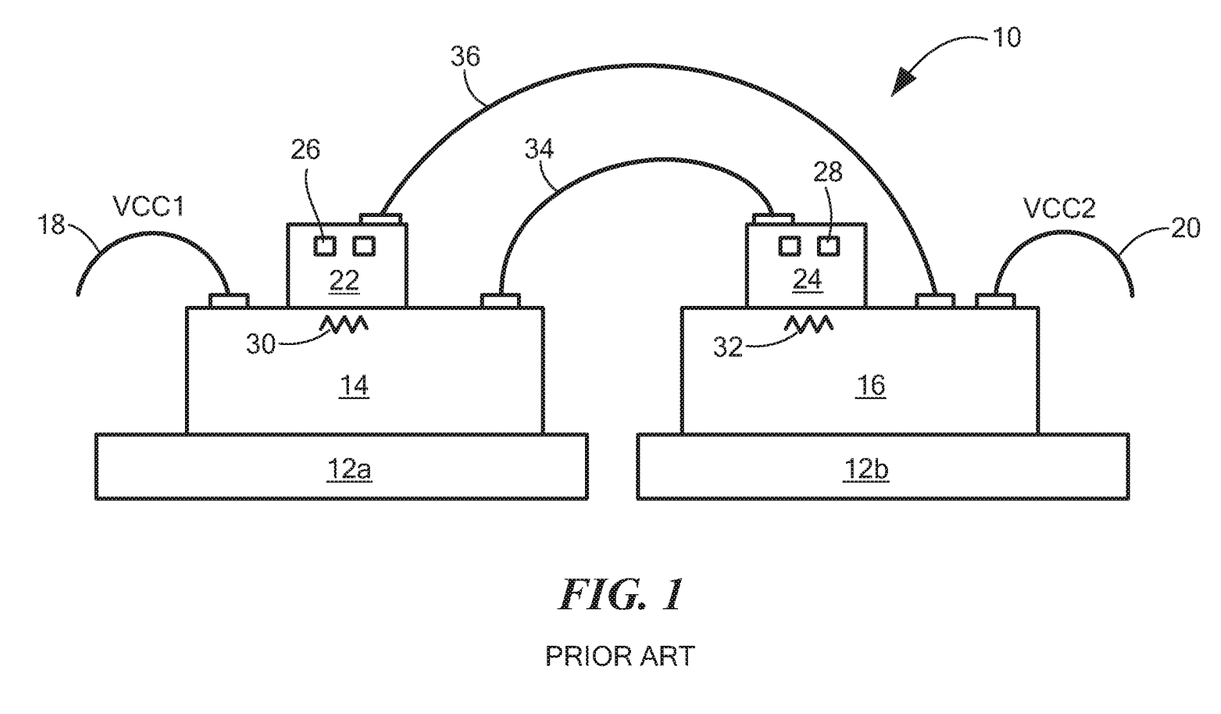
FIG. 1 is a schematic view of a prior art signal isolator.

FIG. 1 shows a conventional signal isolator 10 having a split paddle with first and second isolated paddle portions 12a, 12b. A first die 14 is disposed on the first paddle portion 12a and a second die 16 is disposed on the second paddle portion 12b. The first die 14 is coupled to a first supply voltage 18, shown as VCC1, and the second die 16 is coupled to a second supply voltage 20, shown as VCC2. The isolator 10 passes signals between first and second domains, shown as VCC1 and VCC2, that are galvanically isolated from each other. Required isolation levels can be 15 kV or more for certain applications.

The first die 14 supports a first insulating layer 22 of dielectric material (e.g. $SiO_2$, SiOH, $Al_2O_3$) and the second die 16 supports a second insulating layer 24. A first section of the first insulating dielectric 22 supports a first magnetic coil 26 (e.g. Al, Cu metallization) and the second insulating dielectric 24 supports a second magnetic coil 28. A first sensor 30, such as magnetic field sensing element, is located in proximity to the first coil 26, and a second sensor 32 is located proximate the second coil 28. A first signal 34 in the first domain (VCC1) is transmitted from the first die 14 to the second die 16 at the second coil 28 for detection by the second sensing element 32. A second signal 36 in the second domain (VCC2) is transmitted from the second die 16 to the first die 14 at the first coil 26 for detection by the first sensing element 30. Each coil/sensor pair provides magnetic coupling and serves to communicate signals between the two domains while maintaining galvanic isolation. The first and second die 14, 16 can include circuitry to process the signal from a respective sensor and/or control the cross-coupled coils.

SUMMARY

Embodiments of the invention provide signal isolator integrated circuits having an interposer die that may support magnetic coils and external package interconnects. The isolator can be provided in an integrated circuit (IC) package. In embodiments, an interposer die has a relatively thick dielectric material, which supports isolation levels desired in the isolator applications. In embodiments, an interposer can also support CMOS and/or magnetic sensor die that are flip-chip bumped to the interposer. Galvanic isolation between the circuit components, which are referenced to high and low voltage sides, is achieved by means of vertical and horizontal isolation by spacing part signal path runs between the first and second die.

In one aspect of the invention, a signal isolator comprises: an interposer comprising a dielectric material; a first die disposed on a surface of the interposer; a first magnetic field sensing element associated with the first die; a second die disposed on the surface of the interposer; a second magnetic field sensing element associated with the second die; a first signal path extending from the first die to the second die to transmit data from the first die to the second die, wherein the first and second die are configured for different voltage domains; a second signal path extending from the second die to the first die to transmit data from the second die to the first die, wherein the first signal path is located in the interposer and includes a first coil to generate a magnetic filed in response to current flow, and wherein the second signal path is located in the interposer and includes a second coil to generate a magnetic field in response to current flow, wherein the first coil is located in relation to the second magnetic field sensing element of the second die and the second coil is located in relation to the first magnetic field sensing element of the first die.

A signal isolator can further include one or more of the following features: the interposer includes a substrate on which the dielectric material is disposed, the substrate comprises a semiconductor material, the first and second signal paths are configured to provide horizontal isolation between the first and second die, the horizontal isolation includes locating the first and second signal paths at opposite portions of the interposer, the first and second signal paths are configured to provide vertical isolation between the first and second die, the vertical isolation includes the first coil and the second magnetic field sensing element being vertically aligned and spaced a first distance from each other through the dielectric material of the interposer, the first magnetic field sensing element comprises a Hall element, the first magnetic field sensing element comprises a magnetoresistance element, the first magnetic field sensing element comprises a giant magnetoresistance (GMR) element, the first magnetic field sensing element comprises a tunneling magnetoresistance (TMR) element, a space is formed between the first die and the interposer, and/or the space is at least partially filled with mold compound.

In another aspect, a method comprises: employing an interposer comprising a dielectric material; disposing a first die on a surface of the interposer with a first magnetic field sensing element associated with the first die; disposing a second die on the surface of the interposer with a second magnetic field sensing element associated with the second die; extending a first signal path from the first die to the second die to transmit data from the first die to the second die, wherein the first and second die are configured for different voltage domains; and extending a second signal path from the second die to the first die to transmit data from the second die to the first die, wherein the first signal path is located in the interposer and includes a first coil to generate a magnetic filed in response to current flow, and wherein the second signal path is located in the interposer and includes a second coil to generate a magnetic field in response to current flow, wherein the first coil is located in relation to the second magnetic field sensing element of the second die and the second coil is located in relation to the first magnetic field sensing element of the first die.

A method can further include one or more of the following features: the interposer includes a substrate on which the dielectric material is disposed, the substrate comprises a semiconductor material, the first and second signal paths are configured to provide horizontal isolation between the first and second die, the horizontal isolation includes locating the first and second signal paths at opposite portions of the interposer, the first and second signal paths are configured to provide vertical isolation between the first and second die, the vertical isolation includes the first coil and the second magnetic field sensing element being vertically aligned and spaced a first distance from each other through the dielectric material of the interposer, the first magnetic field sensing element comprises a Hall element, the first magnetic field sensing element comprises a magnetoresistance element, the first magnetic field sensing element comprises a giant magnetoresistance (GMR) element, the first magnetic field sensing element comprises a tunneling magnetoresistance (TMR) element, a space is formed between the first die and the interposer, and/or the space is at least partially filled with mold compound.

In a further aspect, a signal isolator comprises: an interposer means comprising a dielectric material; a first die disposed on a surface of the interposer; a first magnetic field sensing means associated with the first die; a second die disposed on the surface of the interposer means; a second magnetic field sensing means associated with the second die; a first signal path means extending from the first die to the second die to transmit data from the first die to the second die, wherein the first and second die are configured for different voltage domains; a second signal path means extending from the second die to the first die to transmit data from the second die to the first die, wherein the first signal path means is located in the interposer means and includes a first coil to generate a magnetic filed in response to current flow, and wherein the second signal path means is located in the interposer means and includes a second coil to generate a magnetic field in response to current flow, wherein the first coil is located in relation to the second magnetic field sensing means of the second die and the second coil is located in relation to the first magnetic field sensing means of the first die.

A signal isolator can further include one or more of the following features: the interposer includes a substrate on which the dielectric material is disposed, the substrate comprises a semiconductor material, the first and second signal paths are configured to provide horizontal isolation between the first and second die, the horizontal isolation includes locating the first and second signal paths at opposite portions of the interposer, the first and second signal paths are configured to provide vertical isolation between the first and second die, the vertical isolation includes the first coil and the second magnetic field sensing element being vertically aligned and spaced a first distance from each other through the dielectric material of the interposer, the first magnetic field sensing element comprises a Hall element, the first magnetic field sensing element comprises a magnetoresistance element, the first magnetic field sensing element comprises a giant magnetoresistance (GMR) element, the first magnetic field sensing element comprises a tunneling magnetoresistance (TMR) element, a space is formed between the first die and the interposer, and/or the space is at least partially filled with mold compound.

BRIEF DESCRIPTION OF THE DRAWINGS

The foregoing features of this invention, as well as the invention itself, may be more fully understood from the following description of the drawings in which.

DETAILED DESCRIPTION

Figure 2:
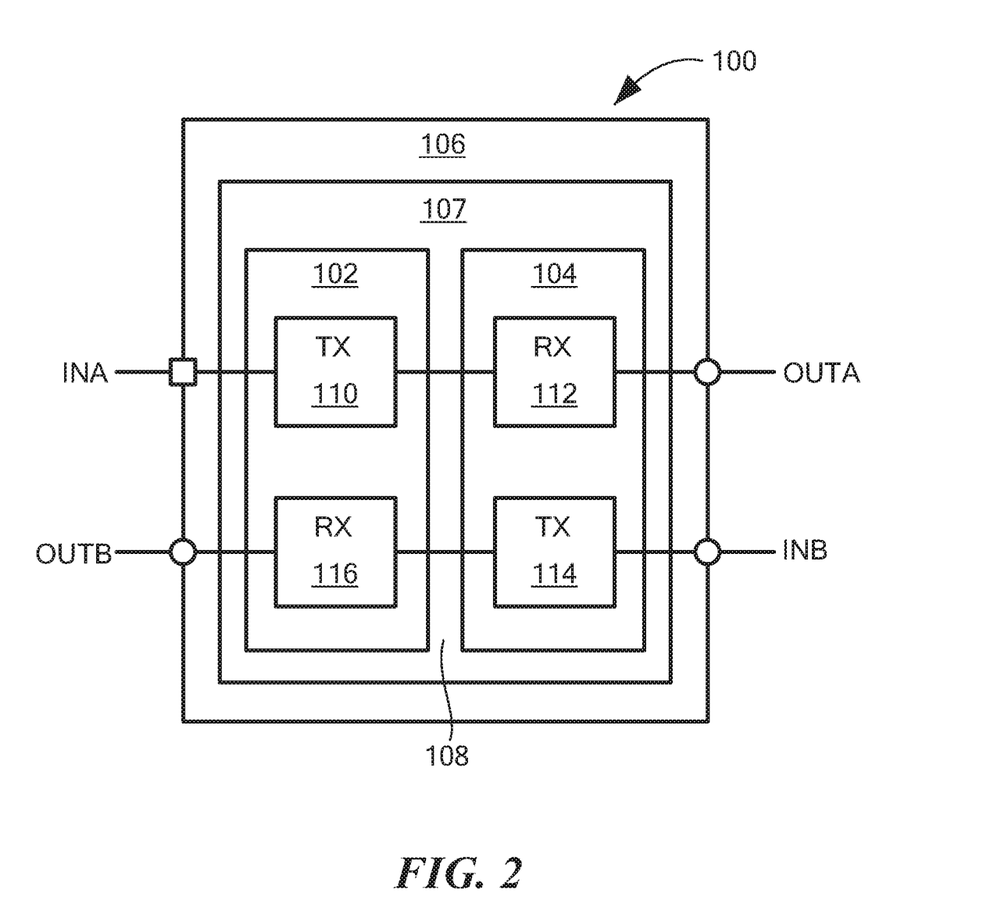
FIG. 2 is a schematic representation of an example signal isolator having an interposer in accordance with example embodiments of the invention.

FIG. 2 shows an example of a signal isolator 100 including first and second die 102, 104 that form part of an integrated circuit package 106 providing signal isolation with an interposer die 107, as shown and described more fully below. In an embodiment, the IC package 106 includes a first input signal INA connected to the first die 102 and a first output signal OUTA connected to the second die 104. The IC package 106 further includes a second input signal INB connected to the second die 104 and a second output signal OUTB to the first die 102. The first and second dies 102, 104 are separated by a barrier region 108, such as a high voltage barrier.

In embodiments, the first die 102 includes a first transmit module 110 and the second die includes a first receive module 112 that provides a signal path from the first input signal INA to the first output signal OUTA across the barrier 108. The second die 104 includes a second transmit module 114 and the first die 102 includes a second receive module 116 that provides a signal path from the second input signal INB to the second output signal OUTB across the barrier 108.

As described more fully below, the first and second die 102, 104 are supported by the interposer 107, which provides the signal paths between the die with galvanic isolation. In embodiments, the first and second die 102, 104 can include respective magnetic field sensing elements proximate coils in the signal paths to enable data transfer between the die.

It is understood that any practical number of transmit, receive, and transmit/receive modules can be formed on the first and/or second die to meet the needs of a particular application. It is further understood that transmit, receive, and transmit/receive modules can comprise the same or different components. In addition, in embodiments, bi-directional communication is provided across the barrier. Further, circuity in the first and/or second die can provided to process signals, perform routing of signals, and the like. In some embodiments, sensing elements are formed in, on, or about the first and/or second die.

Example signal processing may include amplification of sensor signal; conditioning of sensor signal; conversion of sensor signal from analog to digital form; various forms of digital signal processing, including calculations, transformations, comparison, and/or storage, etc. Such processing may be accomplished using microprocessor/memory implementation; conversion of signal back into analog form for further amplification to required output levels, and the like.

Figure 3A:
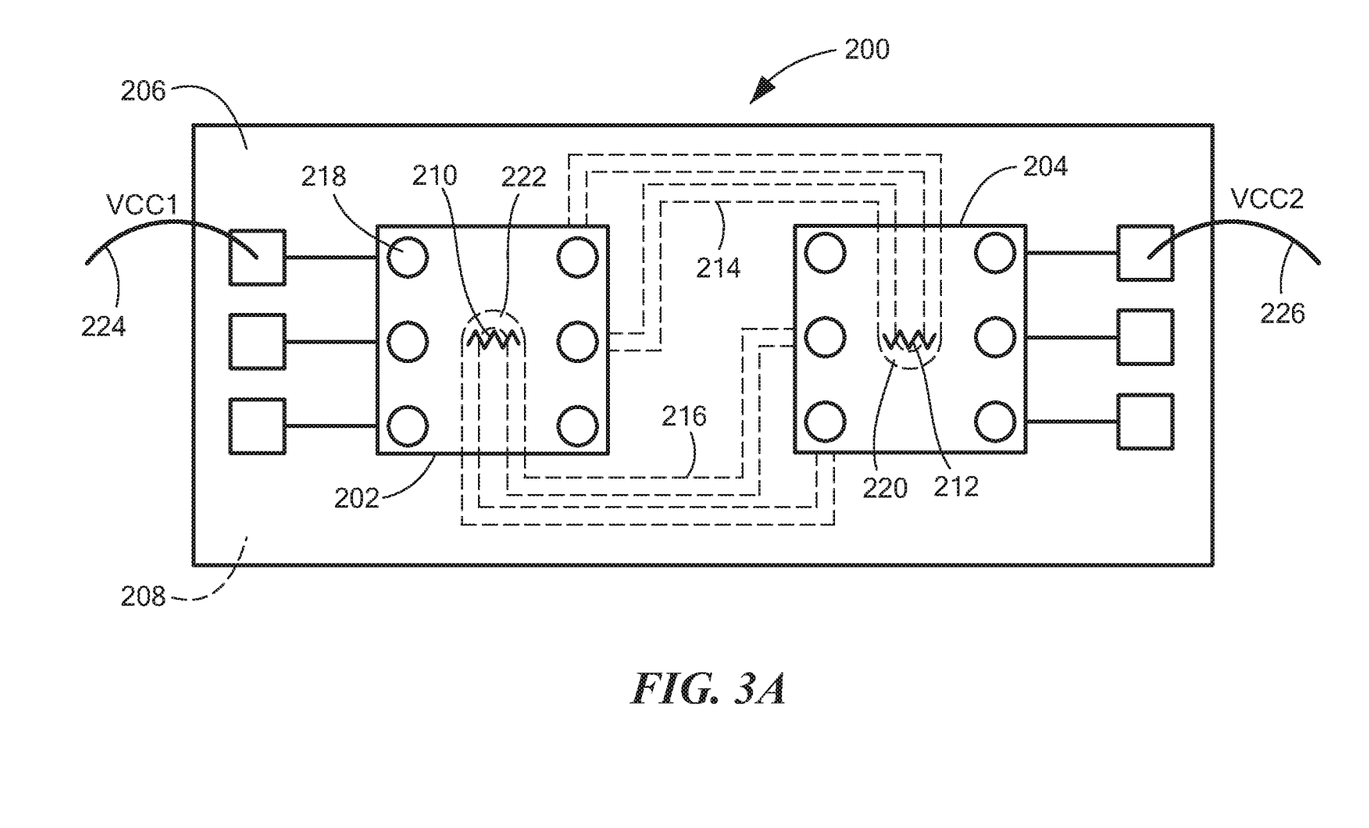
FIG. 3A is a top view of signal isolator in accordance with example embodiments of the invention.
Figure 3B:
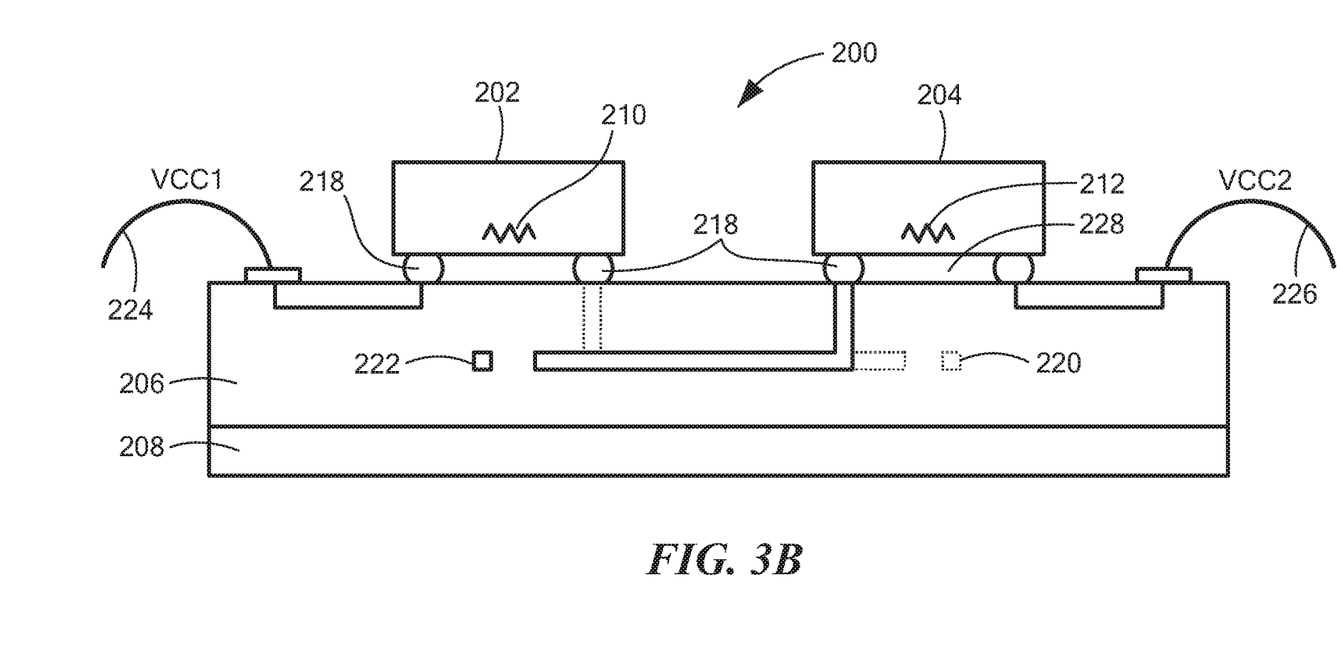
FIG. 3B is cross-sectional view of the isolator of FIG. 3A.
Figure 3C:
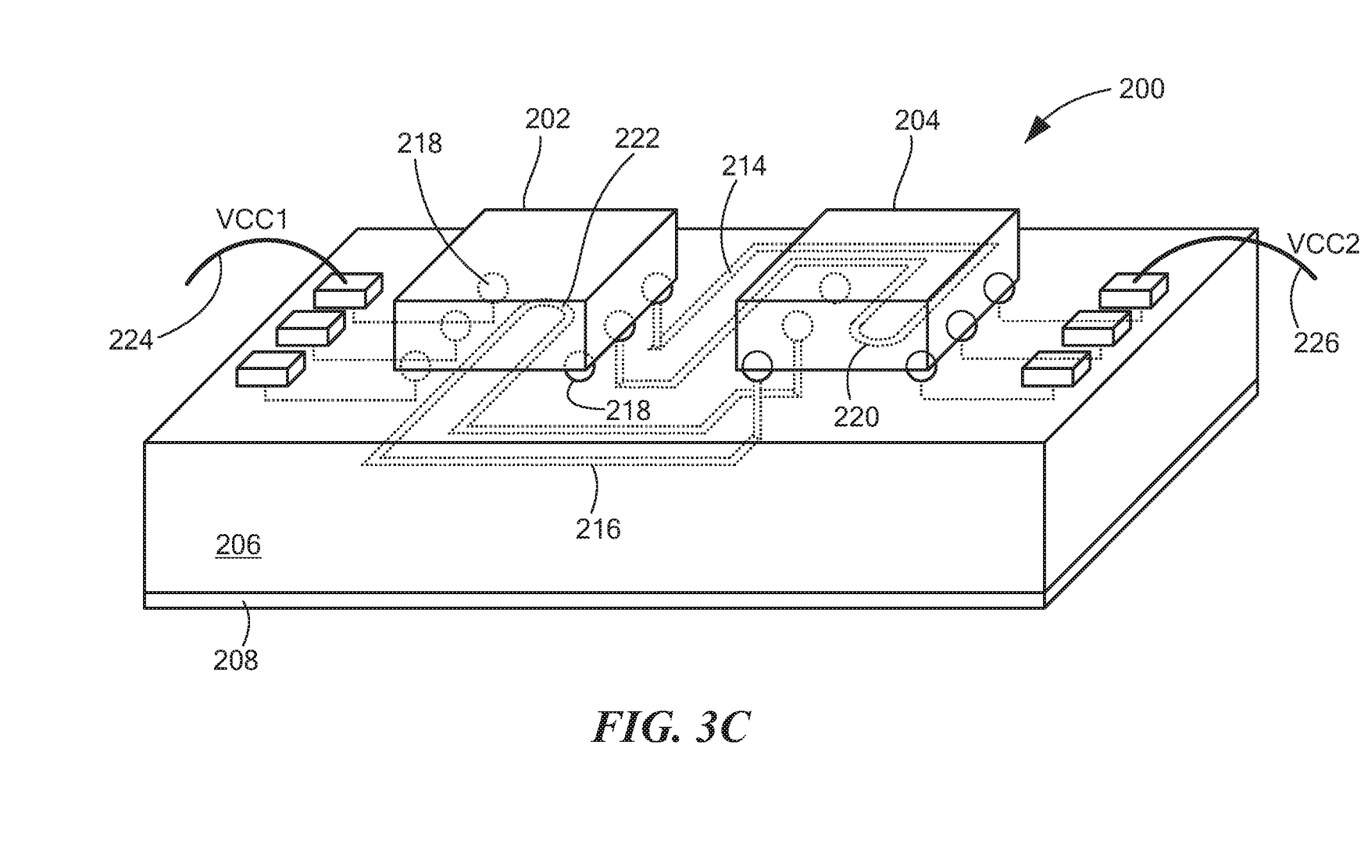
FIG. 3C is a perspective view of the isolator of FIG. 3A.

FIGS. 3A-3C show an example signal isolator 200 having first and second die 202, 204 supported by an interposer 206. In an example embodiment, the interposer 206 comprises a dielectric material. In another embodiment, the interposer 206 includes a semiconductor substrate 208 supporting dielectric material 206. Example materials include alumina, glass substrates, or FR4, or other polymer laminate substrates, as well as LTCC (low temperature co-fired ceramic materials which may have coils built in as part of the substrate process). For the dielectric material on a substrate (semiconductor or a dielectric substrate) the dielectric material may include but is not limited to a polymer dielectric material (e.g. polyimide, or BCB (benzocyclobutene, for example Cyclotene™ resin available from Dow Chemical Company)) or an inorganic material such as an oxide, nitride, (e.g. $SiO_2$, SiOH, $Al_2O_3$) or combination of dielectric materials. It is understood that for such materials the actual ratio of the atomic elements may not be exactly $Al_2O_3$ or $SiO_2$. The first die 202 includes a first magnetic field sensing element 210 and the second die 204 includes a second magnetic field sensing element 212. A first signal path 214 extends from I/O on the first die 202 into the dielectric 206 and over toward the second die 204 and the second magnetic field sensing element 212. A second signal 216 extends from I/O on the second die 204 into the dielectric 206, over toward the first die 202 and the first magnetic field sensing element 210.

The dielectric layer 206 supports one or more layers of metal runs (e.g., Al, Cu) that can provide the signal paths 214, 216, which can include magnetic coils, signal interconnects, bond pads, etc. In the illustrated embodiment, the first signal path 214 is connected to the first die 202 through micro-bumps 218 to metal interconnects supported by the interposer die 206. Example configurations include solder bumps, stud bumps, and the like. The first signal path 214 also includes a first coil portion 220 within the dielectric 206 that is aligned with the second magnetic field sensing element 212. It is understood that coil metallization may be implemented with one or more than one metal layers and dielectric layers to insulate multiple metal layers. Similarly, the second signal path 216 is connected to the second die 204 through micro-bumps 218 to metal interconnects supported by the interposer die 208. The second signal path 216 also includes a coil portion 222 within the dielectric 206 that is aligned with the first magnetic field sensing element 210.

In embodiments, the first and/or second die 202, 204 can contain the magnetic field sensing elements 210, 212 along with control circuitry to process the signal from the sensing elements and to drive the magnetic coils 220, 222. The magnetic field sensing elements 210, 212 can be placed a given distance from the surface of a respective one of the supporting die 202, 204 to maximize the magnetic coupling to a respective coil 220, 222. The coils 220, 222 are supported by the interposer 206.

Placement of magnetic coils 220, 222 with respect to their corresponding magnetic sensing elements 212, 210 may be optimized to achieve a maximum magnetic coupling while maintaining a required level of dielectric isolation between respective coil and die/sensing element. For a given isolation requirement and depending on the dielectric strength of interposer material, there will be an optimal depth from surface of interposer 206 where a coil may be placed.

In embodiments, the first die 202 is connected to a first voltage supply 224 for a first domain and the second die 204 is connected to a second voltage supply 226 for a second domain, so as to create a voltage barrier between the first and second die. In embodiments, the voltage differential between the first and second domains can range from zero to tens of thousands of volts.

Galvanic isolation between the first and second die 202, 204 circuit components, which are referenced to VCC1 and VCC2 domains, is provided by vertical and horizontal isolation. Vertical isolation is provided by a thickness of interposer 206. The first and second signal paths 214, 216 can be disposed a selected distance below a surface of the interposer 206 surface. In addition, the first and second signal paths 214, 216 can be located at different depths in the interposer 206. Horizontal isolation between domains is provided by lateral spacing along the interposer 206 dielectric. With reference to the example embodiment shown in FIG. 2, it can be seen that the first signal path 214 is located near a top of the page/interposer 206 and the second signal path is located near a bottom of the page/interposer 206 so as to create horizontal isolation. In addition, the first and second signal paths 214, 216 are separated from the left-right perspective as seen on the page. That is, in the area between the first and second die 202, 204, the first and second signal paths 214, 216 are located to increase spacing of the signal runs that extend from the die. For example, the first signal path 214 extends a small distance from a middle connection of the first die 202, and then goes up, while the second signal path 216 extends a small distance from a middle connection of the second die, and goes down. It is understood that left, right, up and down are relative terms for an example embodiment intended to facilitate an understanding of the invention and are not intended as limiting in any way.

In embodiments, a space 228 can be provided between the first and/or second die 202, 204 and the adjacent surface of the interposer 206. In embodiments, the space 228 can initially be filled with air. In other embodiments, the space 228 is filled with a mold compound. The height of the space 228 and the overmold process may be configured to leave a pocket of air in the space 228 after the completion of encapsulation to serve as a cushion against mechanical damage or heating during 10 kV surge stresses, for example. In other embodiments, materials other than air, such as mold compounds, can be used to meet the needs of a particular application. For example, in some embodiments, an electrically-insulating adhesive can be used as an underfill material to provide a stronger mechanical connection, provide a heat bridge, and/or to ensure the solder joints are not stressed due to differential heating of the chip and the rest of the system. The underfill material may distribute thermal expansion mismatch for preventing stress concentration in the solder joints, for example.

In embodiments, since the dummy substrate 208 of the interposer 206 is isolated by the dielectric material, during operation of the isolator the substrate 208 may float up to a relatively high potential between VCC1 and VCC2. It may be desirable to avoid connecting the substrate 208 to a ground terminal of an external IC package. Isolation from the external ground may be preferred.

It is understood that the drawings may not be to scale. In embodiments, the dielectric material 206 may be less than about ten percent of the thickness of substrate 208. In embodiments, dielectric material 206 can be applied in layers. For example, layers of dielectric material can be sequentially applied as conductive material is laid down to provide signal runs in the device.

It is understood that various techniques and materials can be used to provide a signal isolator with an interposer in accordance with embodiments of the invention. In some embodiments, the first and/or second die 202, 204 are provided in a CMOS/BiCMOS/BCD wafer process. In some embodiments, an interposer 206 is manufactured following a back-end wafer process and the first and second die 202, 204 are micro-bumped to the interposer die 206 in the assembly. The interposer 206, first and second die 202, 204 assembly can be mounted on a frame and assembled in an IC package. In embodiments, connection of the interposer 206 to the external package leads may be accomplished using bonding of bond wires or solder bumps to the bond pads on the interposer or other suitable technique known in the art. Where multiple solder bumps are used at different steps, e.g., the die to the substrate and then the substrate to a lead frame, the solders should be selected such that the second solder reflow step does not result in adverse connections of the first solder materials. An over mold packaging technique may be used to encapsulate the multi-chip assembly. The interposer die 206 can comprise a dielectric material on a substrate 208, which can comprise Si, glass and/or sapphire, for example. The manufacturing benefits provided by dielectric on a substrate 208, such as efficient and low cost fabrication, will be readily appreciated by one of ordinary skill in the art. In addition, in contrast with conventional signal isolators, wire bonds to connect first and second dies are eliminated.

Further advantages that may be provided by embodiments of the invention include the use of relatively inexpensive interposer die manufactured using simple back-end flow to support the lateral/vertical distances imposed by the isolation requirements. This is different from traditional isolators that use an area of relatively expensive functional silicon die to support the isolation requirements.

Figure 4:
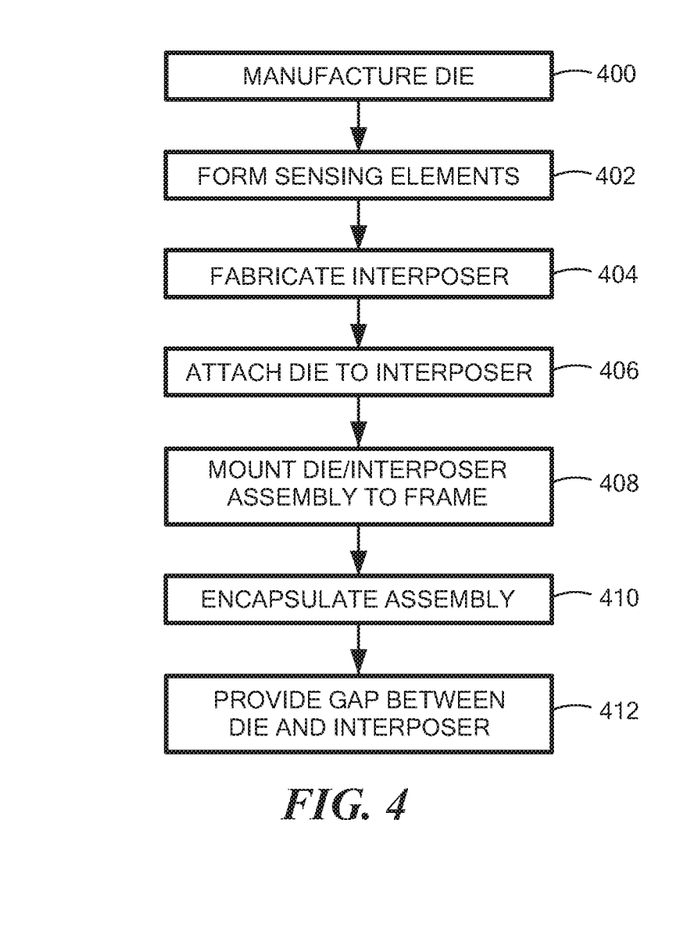
FIG. 4 is a flow diagram showing an example sequence of steps for providing signal isolation in accordance with example embodiments of the invention.

FIG. 4 shows an example process to fabricate a signal isolator having an interposer, such as signal isolator 200 of FIG. 3A in accordance with example embodiments. In step 400, first and second die are manufactured using a suitable wafer process, e.g., CMOS, BiCMOS, BCD, etc. In step 402, a magnetic field sensing element is formed in, on, or near the first and second die. Example sensing elements include Hall elements, GMR, AMR, and TMR elements. In step 404, the interposer is fabricated to include the signal path runs to interconnect the first and second die and/or other connections. The signal paths are formed at a selected depth and location in the interposer to achieve desired signal characteristics. For example, a coil in one of the signal paths should be located a certain distance from a sensing element on the die to achieve a desired sensing relationship between the coil and the sensing element.

In step 406, the first and second die are micro-bumped to the interposer. It is understood that any suitable technique can be used to form electrical connections between the first and second die and the interposer signal paths. In step 408, the die/interposer assembly is mounted to a frame for package assembly. Electrical connections from the interposer to the external package leads can be formed using suitable technique, such as wire bonding. In step 410, the assembly can be encapsulated using overmold packaging techniques well known in the art. In embodiments, in optional step 412, an air-filled gap can be formed between the first and/or second die and the interposer.

While embodiments of the invention are shown in described in conjunction with coil and GMR-based sensing, it is understood that other components, such as capacitor and/or inductive elements, can be used in other embodiments In addition, a variety of magnetic field sensing elements can be used.

As used herein, the term "magnetic field sensing element" is used to describe a variety of electronic elements that can sense a magnetic field. The magnetic field sensing element can comprise, but is not limited to, a Hall Effect element, a magnetoresistance element, and/or a magnetotransistor. As is known, there are different types of Hall Effect elements, for example, a planar Hall element, and/or a vertical Hall element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, a magnetic tunnel junction (MTJ), and a spin-valve. The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

Figure 5:
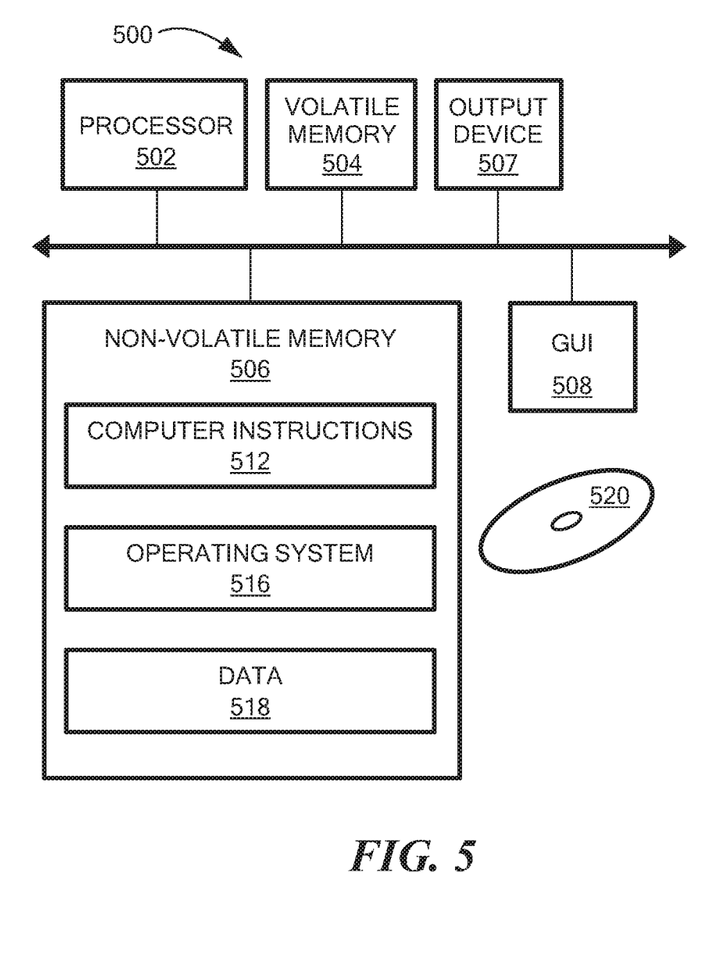
FIG. 5 is a schematic representation of an example computer that may perform at least a portion of the processing described herein.

FIG. 5 shows an exemplary computer 500 that can perform at least part of the processing described herein. The computer 500 includes a processor 502, a volatile memory 504, a non-volatile memory 506 (e.g., hard disk), an output device 507 and a graphical user interface (GUI) 508 (e.g., a mouse, a keyboard, a display, for example). The non-volatile memory 506 stores computer instructions 512, an operating system 516 and data 518. In one example, the computer instructions 512 are executed by the processor 502 out of volatile memory 504. In one embodiment, an article 520 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A signal isolator, comprising:
   an interposer comprising a dielectric material;
   a first die disposed on a surface of the interposer;
   a first magnetic field sensing element associated with the first die;
   a second die disposed on the surface of the interposer;
   a second magnetic field sensing element associated with the second die;
   a first signal path extending from the first die to the second die to transmit data from the first die to the second die, wherein the first and second die are configured for different voltage domains;
   a second signal path extending from the second die to the first die to transmit data from the second die to the first die;
   wherein the first signal path is located in the interposer and includes a first coil to generate a magnetic field in response to current flow, and wherein the second signal path is located in the interposer and includes a second coil to generate a magnetic field in response to current flow, wherein the first coil is located in relation to the second magnetic field sensing element of the second die and the second coil is located in relation to the first magnetic field sensing element of the first die.

2. The signal isolator according to claim 1, wherein the interposer includes a substrate on which the dielectric material is disposed.

3. The signal isolator according to claim 2, wherein the dielectric material comprises at two or more layers.

4. The signal isolator according to claim 2, wherein the substrate comprises a semiconductor material.

5. The signal isolator according to claim 1, wherein the first and second signal paths are configured to provide horizontal isolation between the first and second die.

6. The signal isolator according to claim 5, wherein the horizontal isolation includes locating the first and second signal paths at opposite portions of the interposer.

7. The signal isolator according to claim 1, wherein the first and second signal paths are configured to provide vertical isolation between the first and second die.

8. The signal isolator according to claim 7, wherein the vertical isolation includes the first coil and the second magnetic field sensing element being vertically aligned and spaced a first distance from each other through the dielectric material of the interposer.

9. The signal isolator according to claim 1, wherein the first magnetic field sensing element comprises a Hall element.

10. The signal isolator according to claim 1, wherein the first magnetic field sensing element comprises a magnetoresistance element.

11. The signal isolator according to claim 1, wherein the first magnetic field sensing element comprises a giant magnetoresistance (GMR) element.

12. The signal isolator according to claim 1, wherein the first magnetic field sensing element comprises a tunneling magnetoresistance (TMR) element.

13. The signal isolator according to claim 1, wherein a space is formed between the first die and the interposer.

14. The signal isolator according to claim 13, wherein the space is at least partially filled with mold compound.

15. The signal isolator according to claim 13, wherein the space is at least partially filled with an underfill material.

16. A method, comprising:
    employing an interposer comprising a dielectric material;
    disposing a first die on a surface of the interposer with a first magnetic field sensing element associated with the first die;
    disposing a second die on the surface of the interposer with a second magnetic field sensing element associated with the second die;
    extending a first signal path from the first die to the second die to transmit data from the first die to the second die, wherein the first and second die are configured for different voltage domains; and
    extending a second signal path from the second die to the first die to transmit data from the second die to the first die,
    wherein the first signal path is located in the interposer and includes a first coil to generate a magnetic field in response to current flow, and wherein the second signal path is located in the interposer and includes a second coil to generate a magnetic field in response to current flow, wherein the first coil is located in relation to the second magnetic field sensing element of the second die and the second coil is located in relation to the first magnetic field sensing element of the first die.

17. The method according to claim 16, wherein the interposer includes a substrate on which the dielectric material is disposed.

18. The method according to claim 17, wherein the substrate comprises a semiconductor material.

19. The method according to claim 16, wherein the first and second signal paths are configured to provide horizontal isolation between the first and second die.

20. The method according to claim 19, wherein the horizontal isolation includes locating the first and second signal paths at opposite portions of the interposer.

21. The method according to claim 19, wherein the first and second signal paths are configured to provide vertical isolation between the first and second die.

22. The method according to claim 21, wherein the vertical isolation includes the first coil and the second magnetic field sensing element being vertically aligned and spaced a first distance from each other through the dielectric material of the interposer.

23. The method according to claim 16, wherein the first magnetic field sensing element comprises a Hall element.

24. The method according to claim 16, wherein the first magnetic field sensing element comprises a magnetoresistance element.

25. The method according to claim 16, wherein the first magnetic field sensing element comprises a giant magnetoresistance (GMR) element.

26. The method according to claim 16, wherein the first magnetic field sensing element comprises a tunneling magnetoresistance (TMR) element.

27. The method according to claim 16, wherein a space is formed between the first die and the interposer.

28. The method according to claim 27, wherein the space is at least partially filled with mold compound.

29. A signal isolator, comprising:
- an interposer means comprising a dielectric material;
- a first die disposed on a surface of the interposer;
- a first magnetic field sensing means associated with the first die;
- a second die disposed on the surface of the interposer means;
- a second magnetic field sensing means associated with the second die;
- a first signal path means extending from the first die to the second die to transmit data from the first die to the second die, wherein the first and second die are configured for different voltage domains;
- a second signal path means extending from the second die to the first die to transmit data from the second die to the first die;
- wherein the first signal path means is located in the interposer means and includes a first coil to generate a magnetic field in response to current flow, and wherein the second signal path means is located in the interposer means and includes a second coil to generate a magnetic field in response to current flow, wherein the first coil is located in relation to the second magnetic field sensing means of the second die and the second coil is located in relation to the first magnetic field sensing means of the first die.

30. The signal isolator according to claim 29, wherein the interposer means includes a substrate on which the dielectric material is disposed.

* * * * *